United States Patent
Yamada et al.

(10) Patent No.: US 6,313,398 B1
(45) Date of Patent: Nov. 6, 2001

(54) GA-DOPED MULTI-CRYTSALLINE SILICON, GA-DOPED MULTI-CRYSTALLINE SILICON WAFER AND METHOD FOR PRODUCING THE SAME

(75) Inventors: Toru Yamada; Katsushi Tokunaga; Teruhiko Hirasawa, all of Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 09/593,804

(22) Filed: Jun. 15, 2000

(30) Foreign Application Priority Data

Jun. 24, 1999 (JP) .................................................. 11-178555

(51) Int. Cl.[7] ..................... H01L 31/028; H01L 31/0264; H01L 31/04; C01B 33/02
(52) U.S. Cl. .......................... 136/258; 136/261; 136/262; 423/348; 420/578; 438/97; 438/914; 438/532; 438/557; 257/75; 257/431; 257/66; 257/70
(58) Field of Search .............................. 136/258 PC, 261, 136/262; 423/348; 420/578; 438/97, 914, 532, 557; 257/75, 431, 66, 70

(56) References Cited

U.S. PATENT DOCUMENTS

| | | | |
|---|---|---|---|
| 3,978,333 | * 8/1976 | Crisman et al. | 136/258 |
| 4,129,463 | * 12/1978 | Cleland et al. | 136/258 |
| 4,312,700 | * 1/1982 | Helmreich et al. | 264/300 |
| 4,366,024 | * 12/1982 | Ast et al. | 136/258 |

FOREIGN PATENT DOCUMENTS 55-3644-A * 1/1980 (JP).

OTHER PUBLICATIONS

J. Schmidt et. al., *Investigation of Carrier Lifetime Instabilities in Cz–Grown Silicoon*, 26th IEEE Photovoltaic Specialists Conference, pp. 1–6, 1997.

* cited by examiner

Primary Examiner—Alan Diamond
(74) Attorney, Agent, or Firm—Oliff & Berridge, PLC

(57) ABSTRACT

There are disclosed multi-crystalline silicon which is added with Ga (gallium) as a dopant and a method for producing Ga-doped multi-crystalline silicon, which comprises adding Ga to silicon melt in a crucible, which is melted by heating, and cooling the silicon melt to allow growth of multi-crystalline silicon. According to the present invention, there are provided multi-crystalline silicon and a multi-crystalline silicon wafer for producing solar cells showing stable conversion efficiency for light energy without causing photo-degradation as well as methods for producing them.

8 Claims, 1 Drawing Sheet

GA-DOPED MULTI-CRYTSALLINE SILICON, GA-DOPED MULTI-CRYSTALLINE SILICON WAFER AND METHOD FOR PRODUCING THE SAME

BACKGROUND OF THE INVENTION

1. Field of the Invention

The present invention relates to multi-crystalline silicon, which is useful as, in particular, a material of solar cells, a multi-crystalline silicon wafer, a method for producing the crystal, and a multi-crystalline silicon solar cell using it.

2. Related Art

Characteristics of solar cells are explained first with reference to the materials for substrates constituting the solar cells. When solar cells are classified based on the materials of-substrates, they are categorized into three groups, "silicon crystal solar cells", "amorphous silicon solar cells", and "compound semiconductor solar cells". Further, the silicon crystal solar cells include "single crystal silicon solar cells" and "multi-crystalline silicon solar cells". Among these, solar cells exhibiting high conversion efficiency, which is the most important characteristic as a solar cell, are the "compound semiconductor solar cells", and their conversion efficiency reaches almost 25%. However, production of compound semiconductors, the materials of the compound semiconductor solar cells, is extremely difficult, and thus they have a problem for wide use in view of their production cost. Therefore, their applications have been limited.

The term "conversion efficiency" used herein is a value indicating "a ratio of energy which can be drawn as electric energy converted from light energy by a solar cell relative to energy of light entering the solar cell", and more specifically, it refers to a value defined by the following equation: [Conversion efficiency]=[Electric power which can be drawn out from unit area of cell]/[light energy irradiated on the unit area of the cell]×100 (%)

As solar cells exhibiting high conversion efficiency in the next place to the compound semiconductor solar cells, there can be mentioned single crystal silicon solar cells, and they show generation efficiency of around 20%, which means that they show conversion efficiency near that of the compound semiconductor solar cells. However, the material cost of such single crystal silicon solar cells constitutes about ½ of their whole production cost, and thus they also has a drawback of difficulty in cost reduction.

Therefore, because of low production cost of solar cell substrates, multi-crystalline silicon solar cells have been put into practical use and most frequently produced at present, in spite of their conversion efficiency of 5–15%, which is inferior to those of the aforementioned two kinds of solar cells.

Now, the method for producing usual multi-crystalline silicon solar cells will be explained briefly. First, in order to obtain silicon wafers used as substrates of solar cells, electronic grade-silicon is charged into a crucible made of quartz or the like, then the silicon in the crucible is melted by heating the crucible in a heating region, and multi-crystalline silicon is grown by cooling the crucible by descending the crucible from the heating region to obtain a multi-crystalline silicon ingot. Further, this ingot is sliced into thin wafers having a thickness of, for example, about 300 μm, and mechanical damages on the wafer surfaces is removed by etching the wafer surfaces with a chemical solution to obtain wafers (substrates) to be used it solar cells. Each of these wafers is subjected to a diffusion treatment for diffusing impurities (dopant) to form a PN junction on one side of the wafer, then an anti-reflection film is provided for reducing loss of light energy due to light reflection on the surface on which solar light is irradiated, and finally electrodes are attached to the both sides of the wafer to complete a solar cell.

While the demand of solar cells has been increasing in recent years as one of clean energy sources with the background of the problem of environmental protection, their higher energy cost compared with usual commercial electric power causes obstruction of their wide use. For the cost reduction of silicon crystal solar cells, it is important to reduce the production cost of substrates, and it can be said that multi-crystalline silicon solar cells of which substrates can be produced at low cost satisfy such demand.

On the other hand, however, it is also important to further increase the conversion efficiency of solar cells. Solar cells generate electromotive force through separation of carriers generated by light by an internal electric field. Therefore, it is desirable that lifetime of the generated carriers is as long as possible, and longer carrier lifetime affords higher conversion efficiency.

However, multi-crystalline silicon produced by melting electronic grade-silicon and solidifying it by cooling, as is the current mainstream of the production method of multi-crystal ingots, suffers from a problem concerning conversion efficiency, when solar cells are produced from it. That is, in such solar cells, if a certain period of time passes after irradiation of strong light, lifetime of carriers is reduced in substrates of the solar cells. Therefore, conversion efficiency is reduced, and sufficient conversion efficiency cannot be stably obtained. Therefore, improvement of this problem is desired from the viewpoint of performance of solar cells.

It is known that the cause of the reduction of carrier lifetime caused by irradiation of strong light, when solar cells are produced from such multi-crystalline silicon, is influence of boron and oxygen that exist in the multi-crystal substrates. The conduction type of wafers currently used in solar cells is mainly P-type, and P-type wafers are usually added with boron as a dopant. Further, oxygen also exists in crystals of the multi-crystalline silicon. For these reasons, the multi-crystalline silicon suffers from the problem that lifetime characteristics are affected by boron and oxygen in P-type multi-crystalline silicon, and there is caused photo-degradation.

On the other hand, it is not preferable to significantly reduce the doping amount of boron, since wafers having a resistivity as low as possible are desirable as wafers for solar cells. Further, as also for oxygen, it is also inevitably incorporated into multi-crystalline silicon, because quartz is used in its production, and silicon melt is contained in it in order to increase purity of multi-crystalline silicon. In addition, if the oxygen concentration in crystal silicon is unduly lowered, mechanical strength of the crystal silicon would be degraded. Therefore, conventional solar cells obtained by using multi-crystalline silicon suffer from problems of reduction and instability of conversion efficiency, when they are used for a long period of time.

SUMMARY OF THE INVENTION

The present invention has been accomplished in view of the aforementioned problems, and its object is to provide multi-crystalline silicon and a multi-crystalline silicon wafer for producing solar cells that shows stable conversion efficiency without causing photodegradation, as well as methods for producing them.

The present invention has been accomplished in order to achieve the aforementioned object, and provides multi-crystalline silicon which is added with Ga (gallium) as a dopant.

As multi-crystalline silicon used for silicon solar cells, P-type multi-crystalline silicon doped with boron (henceforth also referred to as B) has hitherto been mainly used. However, by using multi-crystal doped with Ga instead of boron as a solar cell substrate, a stable solar cell of high conversion efficiency can be produced without being influenced by photodegradation when it is made into a solar cell.

In a preferred embodiment of the aforementioned multi-crystalline silicon of the present invention, concentration of Ga contained in the crystal is $3\times10^{14}$ atoms/cm$^3$ to $2\times10^{17}$ atoms/cm$^3$.

As a substrate of solar cell, a substrate with low resistivity and long lifetime is desired. However, unduly low resistivity of substrate wafers causes decrease of lifetime due to the Auger recombination in the substrates, and thus conversion efficiency is reduced. Therefore, the amount of gallium contained in the silicon multi-crystal of the present invention is preferably $2\times10^{17}$ atoms/cm$^3$ or less.

On the other hand, unduly high substrate resistivity also causes a problem. That is, when a solar cell is produced with a substrate of higher resistivity, electric power is consumed due to internal resistance of the solar cell, and thus its conversion efficiency is reduced similarly. For this reason, the concentration of gallium in the multi-crystal is preferably $3\times10^{14}$ atoms/cm$^3$ or higher when it is used as a substrate material of solar cells.

The present invention also provides a Ga-doped multi-crystalline silicon wafer, which is obtained by slicing the aforementioned multi-crystalline silicon.

By using such a multi-crystalline silicon wafer doped with Ga as a substrate material of solar cells, the reduction of carrier lifetime caused by the influence of oxygen contained in the crystal can be suppressed. Therefore, it is possible to obtain long lifetime required for solar cells even in a multi-crystalline silicon wafer of high oxygen content. This makes it possible to obtain a proper lifetime even in a cell of a low resistivity, and to produce a solar cell of high performance without degrading the conversion efficiency even if it is a solar cell utilizing a substrate wafer of high oxygen concentration.

Thus, the Ga-doped multi-crystalline silicon and the Ga-doped multi-crystalline silicon wafer of the present invention are particularly useful when they are used in solar cells.

Moreover, a multi-crystalline silicon solar cell produced from such Ga-doped multi-crystalline silicon or Ga-doped multi-crystalline silicon wafer shall be inexpensive and have high energy conversion efficiency.

That is, for example, if a Ga-doped multi-crystalline silicon ingot is processed into a substrate for solar cells and a solar cell is produced by using the wafer, there can be produced a solar cell showing stable conversion efficiency even when it is irradiated with strong light for a long period of time. If Ga-doped multi-crystalline silicon is used as a material of a solar cell, a solar cell of sufficient conversion efficiency can be produced since the lifetime of carriers in the substrate will be stabilized.

In the conventional boron-doped multi-crystalline silicon, as the doped boron increases and hence resistivity becomes low, lifetime of carriers is more decreased after use for a long period of time, and thus it becomes impossible to produce a solar cell with stable conversion efficiency and low resistivity. However, by using the Ga-doped multi-crystalline silicon and the Ga-doped multi-crystalline silicon wafer of the present invention, a solar cell exhibiting stable conversion efficiency and low resistivity for a long period of time can be produced.

Furthermore, the present invention also provides a method for producing Ga-doped multi-crystalline silicon, which comprises adding Ga to silicon melt in a crucible, which is melted by heating, and cooling the silicon melt to allow growth of multi-crystalline silicon.

In this way, the Ga-doped multi-crystalline silicon can be produced.

In a preferred embodiment of the aforementioned method, Ga is added to the silicon melt by using a doping agent which is produced beforehand by growing a silicon crystal added with Ga at a high concentration, and pulverizing the silicon crystal doped with Ga at a high concentration.

As a method for doping Ga when the Ga-doped multi-crystal is produced according to the present invention, gallium may be directly added to multi-crystalline silicon before its melting, or melted silicon. However, when multi-crystal doped with gallium is mass-produced in an industrial scale, it is preferable to produce a doping agent beforehand and perform the doping by using it. By using such a method, the operation can efficiently be performed because of the following reasons. The amount of Ga to be added is extremely smaller than the amount of silicon. Moreover, gallium has a low melting point of 30° C. and hence is difficult to be handled. Therefore, by performing the doping with a doping agent produced beforehand, the Ga concentration can more easily be adjusted with higher accuracy and exact dopant concentration can be obtained, rather than by directly adding gallium to the silicon melt. Moreover, handling of the doping agent itself becomes easier compared with the case where gallium is directly added into silicon melt, and therefore workability is also improved.

According to the present invention, by doping Ga into multi-crystalline silicon and a multi-crystalline silicon wafer, there can be provided multi-crystalline silicon and a multi-crystalline silicon wafer for producing solar cells showing a high conversion efficiency for light energy without causing photodegradation.

BEST MODE FOR CARRYING OUT THE INVENTION

Figure 1:
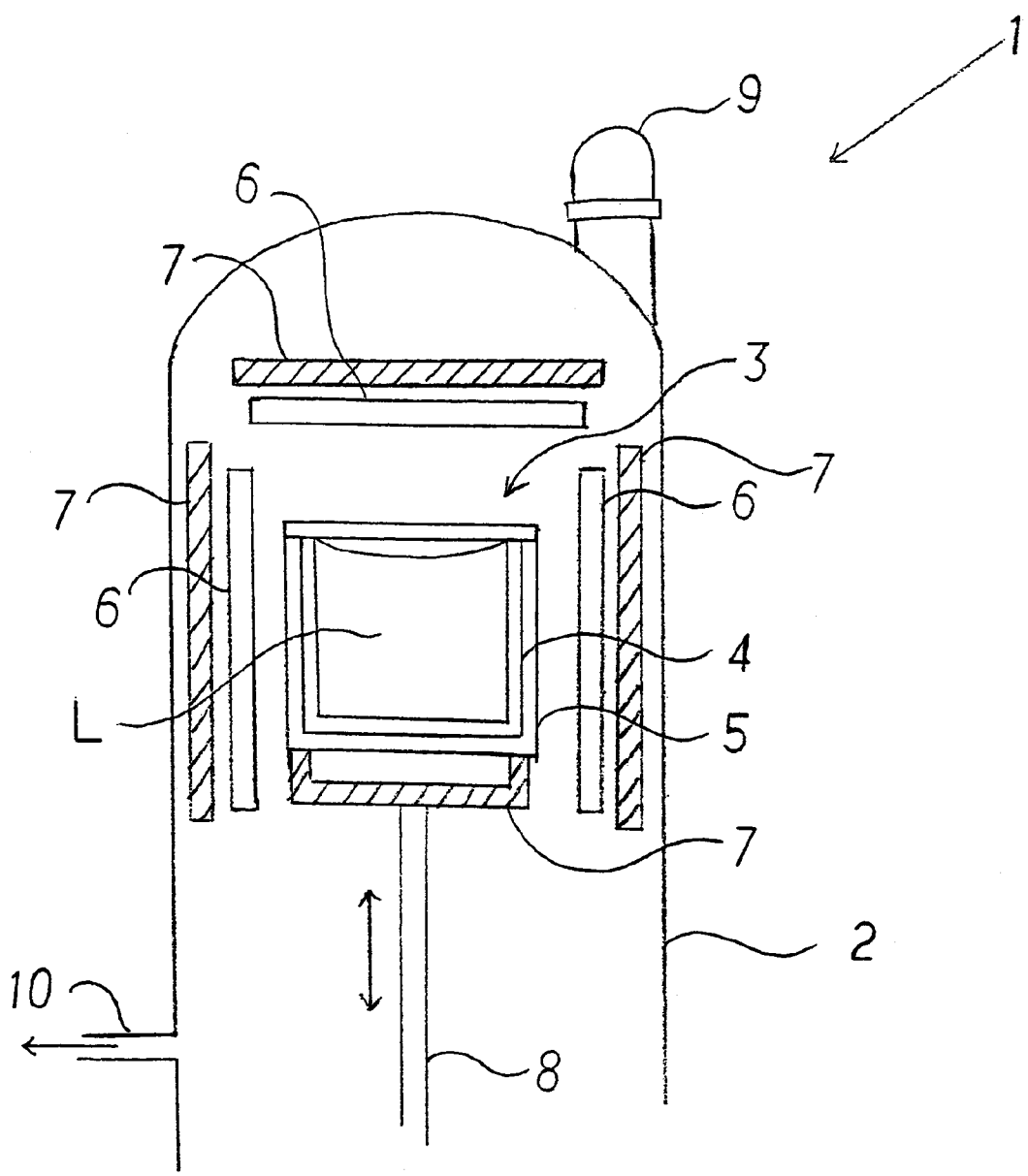
FIG. 1 shows an exemplary structure of an apparatus for producing multi-crystal used for the present invention. The apparatus 1 for producing multi-crystal comprises a chamber 2, crucible 3, quartz crucible 4, graphite crucible 5, heaters 6, heat shielding panels 7, crucible supporting shaft 8, feed opening 9, and exhaust port 10, and contains silicon melt L.

Hereafter, the present invention will be explained in more detail. However, the present invention is not limited by the following explanation.

The inventors of the present invention earnestly studied and repeated experiments about the theme of how to obtain a substrate which can be relatively easily produced, mass-produced as a substrate of solar cell, and shows high conversion efficiency when it is used as a substrate material of solar cell. As a result, they accomplished the present invention.

It is considered that there is caused the reduction of conversion efficiency, which is observed in a solar cell produced from conventional multi-crystalline silicon of P-type added with boron as a dopant after irradiation with light for a long period of time, because a complex of boron and oxygen is produced by light irradiation and becomes a recombination center of carriers. That is, it is considered that the coexistence of oxygen and boron in the crystal changes energy level of a PN junction of a solar cell to form a deep energy level (also referred to as "deep level" or "trap level") at the junction, and carriers in the solar cell are captured by this deep energy level, which causes the reduction of carrier lifetime (Investigation of carrier lifetime instabilities in CZ•grown silicon, Jan Schmidt et al., 26th IEEE Photovoltaic specialists conference, 1997).

Therefore, the inventors of present invention paid attention to the fact that the reduction of the substrate lifetime occurred only when oxygen and boron are simultaneously exist, whereas no change of the lifetime is observed and thus photodegradation is not caused with existence of either one of oxygen and boron, and conceived production of P-type multi-crystalline silicon by using an element other than boron. Thus, the present invention has been accomplished.

The inventors of the present invention considered that, while a P-type silicon wafer was mainly used for a solar cell substrate, if P-type multi-crystalline silicon could be produced by using an element other than boron, it would be possible to produce a solar cells showing little photodegradation, in which the reduction of substrate lifetime did not occur even if oxygen existed in the crystal, and repeated experiments. As a result, it was confirmed that, if P-type multi-crystalline silicon was produced by using gallium as a dopant, and a solar cell substrate was produced from it, there could be aproduced a solar cell by using the substrate, which solar cell showed constantly stable lifetime and no reduction of conversion efficiency even if the crystal contained oxygen at a high concentration.

This makes it possible to produce a solar cell causing no photodegradation and stably exhibiting high conversion efficiency even after use for a long period of time even from multi-crystalline silicon showing a high oxygen concentration. Thus, the power generation cost of multi-crystalline silicon solar cells can be reduced. Therefore, the present invention greatly contributes to solution of the problem concerning the cost of silicon raw material for solar cells.

PREFERRED EMBODIMENT OF THE INVENTION

Hereafter, embodiments of the present invention will be explained. However, the present invention is not limited to these.

First, an exemplary structure of an apparatus for producing multi-crystal used for the present invention will be explained by referring to FIG. 1.

As shown in FIG. 1, the apparatus 1 for producing multi-crystal comprises a chamber 2, which accommodates a crucible 3 in which raw materials are melted. The chamber 2 has a feed opening 9 for feeding the raw materials into the apparatus, and the raw materials, silicon, Ga and so forth, are fed from this feed opening 9 at any time. Further, the chamber 2 has an exhaust port 10. This exhaust port 10 is connected to a non-illustrated vacuum pump, so that it can reduce the pressure of the inside of the chamber to a predetermined pressure.

The crucible 3 in the chamber 2 is constituted by an inside quartz crucible 4, and an outside I graphite crucible 5. Heaters 6, which are for melting the raw material silicon charged in the crucible by heating, are disposed around and above the crucible 3 so that they should surround the crucible 3 to form a heating region. Further, the heaters 6 are surrounded by heat shielding panels 7, and a heat shielding panel 7 is also provided at the bottom of the crucible 3, thereby preventing radiant heat emitted by the heaters 6 from escaping from the system. Further, silicon melt L dissolved through heating by the heaters 6 is filled in the crucible. This crucible 3 is supported by a crucible supporting shaft 8, which can be moved up and down. The distance between the crucible 3 and the heating region formed by the heaters 6 can be changed by moving the crucible supporting shaft 8 up and down.

Now, the method for producing multi-crystalline silicon using the aforementioned apparatus will be explained.

First, a mold releasing agent is applied on the internal surface of the quartz crucible 4, so that grown multi-crystalline silicon can be easily taken out from the crucible. Then, raw materials of multi-crystalline silicon and Ga, which is a doping agent, are put into the quartz crucible 4, and the raw materials are melted through heating by the heaters 6. In this operation, it is desirable that a doping agent is preliminarily produced by producing crystal silicon added with Ga at a high concentration, and pulverizing the crystal, and the addition of Ga is attained by adding the doping agent during the melting operation in such an adjusted amount that a desired Ga concentration should be obtained. Because the amount of Ga to be added is extremely smaller than that of the silicon, and Ga has a low melting point of 29.8° C., it is difficult to accurately weigh Ga. However, by performing the addition of Ga in the manner mentioned above, the amount to be weighed is increased, and the problem concerning the melting point will also be eliminated. Therefore, the weighing can be performed more accurately.

Further, during this melting operation of raw materials, the inside of the chamber 2 is decompressed to a predetermined pressure, and maintained in a clean state.

Then, after the whole raw materials of multi-crystalline silicon are melted, the crucible 3 is cooled by descending it from the heating region formed by the heaters 6 at a rate of 0.05 to 0.20 mm/min. In the crucible 3, the melt L begins to solidify from the bottom of the crucible where the cooling advances earlier. As the crucible 3 is descended from the heating region, columnar structure multi-crystalline silicon is grown in the crucible 3. When the whole silicon melt L in crucible 3 is crystallized, a columnar structure multi-crystalline silicon ingot is taken out from the crucible.

Thus, multi-crystalline silicon added with Ga as a doping agent can be obtained. Then, this multi-crystalline silicon ingot is processed into multi-crystalline silicon wafers by slicing it with a cutting machine such as an inner diameter slicer or wire saw in a conventional manner. Of course, these steps are mere examples, and there may be used various other steps such as cleaning step. Further, the steps are used with suitable modification including the alteration of the order of steps, omission of some steps and so forth.

Then, each of these obtained wafers is subjected to a diffusion treatment for diffusing impurities (dopant) to form a PN junction on one side of the wafer, then an anti-reflection film is provided for reducing loss of light energy due to light reflection on the surface on which solar light is irradiated, and finally electrodes are attached to the both sides of the wafer to complete a solar cell.

EXAMPLE

The present invention will be further explained with reference to the following example and comparative example hereinafter. However, the present invention is not limited by these.

Example

Multi-crystalline silicon added with Ga as a doping agent was produced by using such an apparatus for producing multi-crystal as shown in FIG. 1. And a solar cell was manufactured with a wafer produced from the multi-crystalline silicon, and its conversion efficiency was measured.

First, a Ga doping agent was produced. 5 kg of electronic grade-silicon and 50 g of Ga were put into a quartz crucible having a diameter of 15 cm and a depth of 25 cm, melted in a clean electric furnace, and quenched to obtain a silicon crystal doped with Ga at a high concentration. In the crystal, many cracks were generated due to shrinkage during the cooling, and residues of the quartz crucible used as a container, which were adhered on the crystal, were carefully removed. Then, this silicon crystal doped with Ga at a high concentration was pulverized, and cleaned with hydrofluoric acid to obtain a doping agent of high Ga concentration. When this Ga doping agent was analyzed, it was found to have a Ga concentration of $8.6 \times 10^{19}$ atoms/g.

Then, Ga-doped multi-crystalline silicon was produced by using such an apparatus for producing multi-crystal as shown in FIG. 1. 5 kg of electronic grade-silicon and 25 g of the aforementioned Ga doping agents were put into a quartz crucible 4 having a diameter of 15 cm and a depth of 25 cm and being applied with a mold releasing agent, and melted through heating by the heaters 6. Then, the crucible 3 was cooled by descending it from the heat region at a rate of 0.1 mm/min to produce columnar structure multi-crystalline silicon. A 5-cm square rectangular parallelepiped having a thickness of 2 cm was cut out from the center portion of the crystal ingot produced as described above, and it was found to have a resistivity of 1.1 $\Omega \cdot cm$. Further, this rectangular parallelepiped crystal was sliced along the direction perpendicular to the direction of columnar grain to produce a multi-crystalline silicon wafer.

This 5-cm square Ga-doped wafer was immersed in an NaOH solution to eliminate a mechanical damage layer, and then a shallow PN junction having a depth of 0.2 $\mu m$ and a sheet resistance of 78 •/□ was formed by the diffusion method using $POCl_3$. Subsequently, an $SiO_2$ passivation film for stabilizing the surface and a $TiO_2$ film as an anti-reflection film were successively laminated on the surface of the wafer. Then, after an excessive diffusion layer on the back face was eliminated by etching, a BSF (back surface field) layer was formed by printing aluminum paste and firing it. An electrode was formed on each of the surface and the back face of the wafer by printing silver paste and sintering it, and an $MgF_2$ film was finally formed by evaporation on the surface as a 2nd layer anti-reflection layer to complete a solar cell.

Conversion efficiency of the solar cell obtained as described above was measured. This measurement of conversion efficiency was performed as follows. The solar cell was placed on a measurement stand of which temperature was controlled to be 25° C., and irradiated with regular light under a condition of AM (air mass) of 1.5 by a solar simulator utilizing a halogen lamp as a light source. The electrical voltage and the electric current that could be drawn from the cell were measured, and the conversion efficiency of the solar cell was calculated.

When the conversion efficiency of the solar cell was determined as described above, it was found that the cell showed a high value, 16.3%, and thus light energy was efficiently converted into electric energy. Further, after the irradiation of this solar cell with light at AM 1.5 for 30 hours using the solar simulator, the conversion efficiency was measured again. As a result, it showed 16.3% of the conversion efficiency, and the conversion efficiency did not change at all. Thus, it showed stable conversion efficiency.

Comparative Example

Multi-crystalline silicon added with B as a doping agent was produced by using such an apparatus for producing multi-crystal as shown in FIG. 1. And a solar cell was manufactured with a wafer produced from the multi-crystalline silicon, and its conversion efficiency was measured.

That is, B-doped multi-crystalline silicon was produced by using such an apparatus for producing multi-crystal 1 as shown in FIG. 1. 5 kg of electronic grade-silicon and 25 g of a B-doping agent containing boron were put into a quartz crucible 4 having a diameter of 15 cm and a depth of 25 cm and being applied with a mold releasing agent, and melted through heating by the heaters 6. Then, the crucible 3 was cooled by descending it from the heat region at a rate of 0.1 mm/min to produce columnar structure multi-crystalline silicon. A 5-cm square rectangular parallelepiped having a thickness of 2 cm was cut out from the center portion of the crystal ingot produced as described above, and it was found to have a resistivity of 1.0 Ω·cm. Further, this rectangular parallelepiped crystal was sliced along the direction perpendicular to the direction of columnar grain to produce a multi-crystalline silicon wafer.

From this 5-cm square B-doped wafer, a solar cell was produced by using the same process steps as described in the aforementioned example. Conversion efficiency of the solar cell obtained as described above was measured in the same manner as in the example, and it was found to have a conversion efficiency of 16.2%, which was comparable to that obtained in the example. However, when the conversion efficiency was measured again after the irradiation of this solar cell with light at AM 1.5 for 30 hours using the solar simulator, the conversion efficiency was reduced to 15.9%.

The present invention is not limited to the embodiments described above. The above-described embodiments are mere examples, and those having the substantially same structure as that described in the appended claims and providing the similar functions and advantages are included in the scope of the present invention.

For example, while the multi-crystalline silicon was produced by descending a crucible containing silicon melt from a heating region in the aforementioned example, the present invention is not limited to this. For example, it can also be produced by a method where the multi-crystalline silicon is grown from the bottom of crucible by cooling the bottom of crucible by a heat exchanger or the like, while the crucible is fixed in the heating region. Further, a multi-crystal originally in a shape of plate wafer may also be produced, instead of producing a columnar structure multi-crystal ingot.

Any of these methods fall within the scope of the present invention so long as the methods comprising adding Ga to a silicon melt, and then growing a multi-crystal by cooling the silicon melt.

What is claimed is:

1. A multi-crystalline silicon, wherein the multi-crystalline silicon is doped with Ga (gallium) and the concentration of Ga contained in the silicon is $3 \times 10^{14}$ atoms/cm$^3$ to $2 \times 10^{17}$ atoms/cm$^3$.

2. A Ga-doped multi-crystalline silicon wafer, which is obtained by slicing the multi-crystalline silicon according to claim 1.

3. A solar cell comprising the Ga-doped multi-crystalline silicon according to claim 1.

4. A solar cell comprising the Ga-doped multi-crystalline silicon wafer according to claim 2.

5. A multi-crystalline silicon solar cell, which is produced from the Ga-doped multi-crystalline silicon according to claim 1.

6. A multi-crystalline silicon solar cell, which is produced from the Ga-doped multi-crystalline silicon wafer according to claim 2.

7. A method for producing Ga-doped multi-crystalline silicon, which comprises adding Ga to silicon melt in a crucible, which is melted by heating, so that the concentration of Ga contained in the silicon is $3 \times 10^{14}$ atoms/cm$^3$ to $2 \times 10^{17}$ atoms/cm$^3$, and cooling the silicon melt to allow growth of multi-crystalline silicon.

8. The method for producing Ga-doped multi-crystalline silicon according to claim 7, wherein Ga is added to the silicon melt by using a doping agent which is produced beforehand by growing a silicon crystal heavily doped with Ga, and pulverizing the silicon crystal heavily doped with Ga.

* * * * *